United States Patent
Walmsley et al.

(10) Patent No.: US 9,686,864 B2
(45) Date of Patent: Jun. 20, 2017

(54) DEVICE INCLUDING INTERPOSER BETWEEN SEMICONDUCTOR AND SUBSTRATE

(75) Inventors: Robert G Walmsley, Palo Alto, CA (US); Zhuqing Zhang, Corvallis, OR (US); Jennifer Wu, Corvallis, OR (US); Sheldon A Bernard, Corvallis, OR (US); Silam J Choy, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/417,821

(22) PCT Filed: Jul. 31, 2012

(86) PCT No.: PCT/US2012/049048
§ 371 (c)(1),
(2), (4) Date: Jan. 28, 2015

(87) PCT Pub. No.: WO2014/021868
PCT Pub. Date: Feb. 6, 2014

(65) Prior Publication Data
US 2015/0208507 A1    Jul. 23, 2015

(51) Int. Cl.
    H05K 1/18     (2006.01)
    H05K 13/04    (2006.01)
    B81B 7/00     (2006.01)
    G01P 15/08    (2006.01)
    H01L 23/00    (2006.01)

(52) U.S. Cl.
    CPC ............. H05K 1/18 (2013.01); B81B 7/0048 (2013.01); G01P 15/0802 (2013.01); H01L 24/32 (2013.01); H05K 13/0469 (2013.01); *B81B 2201/0235* (2013.01); *H01L 2224/32014* (2013.01); *H05K 2203/06* (2013.01); *Y10T 156/10* (2015.01)

(58) Field of Classification Search
    CPC ....... H05K 1/18; H05K 13/04; H05K 13/0469
    USPC .......................................................... 361/783
    See application file for complete search history.

(56) References Cited

U.S. PATENT DOCUMENTS

| 5,919,329 A | 7/1999 | Banks et al. |
| 5,994,161 A | 11/1999 | Bitko et al. |
| 6,057,178 A | 5/2000 | Galuschki et al. |

(Continued)

FOREIGN PATENT DOCUMENTS

| CN | 1214150 A | 4/1999 |
| CN | 1678513 A | 10/2005 |

(Continued)

OTHER PUBLICATIONS

Supplementary European Search Report, Feb. 11, 2016, EP Patent Application No. 12882090.9, 7 pages.

(Continued)

*Primary Examiner* — Eric Thomas
*Assistant Examiner* — Michael P McFadden
(74) *Attorney, Agent, or Firm* — Dicke, Billig & Czaja, PLLC

(57) ABSTRACT

A device including a semiconductor, a substrate, and an interposer. The interposer is attached between the semiconductor and the substrate to absorb stresses between the semiconductor and the substrate.

12 Claims, 6 Drawing Sheets

(56) References Cited

U.S. PATENT DOCUMENTS

| | | |
|---|---|---|
| 6,383,846 B1 | 5/2002 | Shen et al. |
| 6,444,921 B1* | 9/2002 | Wang ................ H01L 23/49827 |
| | | 174/254 |
| 6,451,625 B1 | 9/2002 | Pu et al. |
| 6,768,196 B2 | 7/2004 | Harney et al. |
| 7,547,579 B1 | 6/2009 | Jiang |
| 2002/0095192 A1 | 7/2002 | Pu et al. |
| 2004/0012086 A1 | 1/2004 | Infantolino et al. |
| 2004/0041248 A1 | 3/2004 | Harney et al. |
| 2004/0112633 A1 | 6/2004 | Endo et al. |
| 2004/0119143 A1 | 6/2004 | Karpman |
| 2005/0056870 A1 | 3/2005 | Karpman et al. |
| 2006/0220045 A1 | 10/2006 | Doan et al. |
| 2007/0080441 A1 | 4/2007 | Kirkman et al. |
| 2007/0170525 A1 | 7/2007 | Eskridge |
| 2007/0205479 A1 | 9/2007 | Dangel et al. |
| 2007/0235861 A1* | 10/2007 | Chien ................ H01L 21/4871 |
| | | 257/712 |
| 2008/0067652 A1 | 3/2008 | Menard et al. |
| 2008/0093748 A1 | 4/2008 | Chen |
| 2008/0164546 A1 | 7/2008 | Kvisteroy et al. |
| 2008/0284041 A1 | 11/2008 | Jang et al. |
| 2008/0303176 A1 | 12/2008 | Peltz et al. |
| 2009/0071260 A1 | 3/2009 | Speldrich |
| 2009/0085161 A1 | 4/2009 | Questad et al. |
| 2009/0267171 A1 | 10/2009 | Yean et al. |
| 2009/0293617 A1 | 12/2009 | McNeil et al. |
| 2009/0315169 A1 | 12/2009 | Weekamp |
| 2010/0147075 A1 | 6/2010 | Magendanz et al. |
| 2010/0207218 A1 | 8/2010 | Taguchi et al. |
| 2010/0224985 A1* | 9/2010 | Michael ............... H01L 23/3114 |
| | | 257/692 |
| 2010/0230808 A1 | 9/2010 | Joerg |
| 2010/0314740 A1* | 12/2010 | Choi ................... H01L 23/3121 |
| | | 257/686 |
| 2011/0027930 A1 | 2/2011 | El-Gamal et al. |
| 2011/0036176 A1 | 2/2011 | Bradley et al. |
| 2011/0183464 A1 | 7/2011 | Takahashi et al. |
| 2012/0025337 A1 | 2/2012 | Leclair et al. |
| 2012/0032328 A1 | 2/2012 | Lin et al. |
| 2012/0086116 A1 | 4/2012 | Taguchi et al. |

FOREIGN PATENT DOCUMENTS

| | | |
|---|---|---|
| CN | 2909520 | 6/2007 |
| CN | 1996575 A | 7/2007 |
| CN | 100587430 | 2/2010 |
| JP | 08008388 | 1/1996 |
| JP | 2000304638 | 11/2000 |
| JP | 2009068882 | 4/2009 |
| JP | 2010036280 | 2/2010 |
| TW | 201207961 A | 2/2012 |
| WO | WO-8803705 | 5/1988 |
| WO | WO-2011081249 | 7/2011 |

OTHER PUBLICATIONS

Li, et al. Low Stress Packaging of a Micromachined Accelerometer; IEEE Transactions on Electronics Packaging Manufacturing, vol. 24, No. 1, Jan. 2001.

Tilmans et al. The Indent Reflow Sealing (IRS) Technique—A Method for the Fabrication of Sealed Cavities for MEMS Devices; Journal of Microelectromechanical Systems, vol. 9.

\* cited by examiner

DEVICE INCLUDING INTERPOSER BETWEEN SEMICONDUCTOR AND SUBSTRATE

BACKGROUND

Micro-electromechanical systems (MEMS) include miniaturized mechanical and electromechanical elements that are made using micro-fabrication techniques. The physical dimensions of MEMS devices vary from well below one micron to several millimeters. Also, MEMS devices vary from relatively simple structures having no moving elements to extremely complex electromechanical systems having multiple moving elements under the control of integrated electronics. Functional elements of MEMS devices include miniaturized structures, micro-electronics, and micro-sensors and micro-actuators that convert energy from one form to another, such as a measured mechanical signal into an electrical signal. MEMS devices include pressure sensors, accelerometers, gyroscopes, microphones, digital mirror displays, and micro fluidic devices, and MEMS devices can be very sensitive to changes in critical dimensions of the devices.

Typically, MEMS accelerometers behave like a damped mass on a spring. When an accelerometer experiences acceleration, the mass is displaced to the point that the spring is able to accelerate the mass at the same rate as the casing. This displacement is measured to give the acceleration. Piezoelectric, piezoresistive, and capacitive components can be used to convert the mechanical motion into an electrical signal.

Some MEMS accelerometers include a proof mass and electrodes that face each other across a small gap. On one side of the gap are rotor electrodes arrayed on the proof mass or rotor. On the other side of the gap are stator electrodes or fixed electrodes, facing the moving rotor electrodes across the gap. Under the influence of external accelerations, the proof mass deflects from its neutral position and the capacitance between the rotor electrodes and the stator or fixed electrodes can be measured to determine the acceleration.

DETAILED DESCRIPTION

Figure 1:
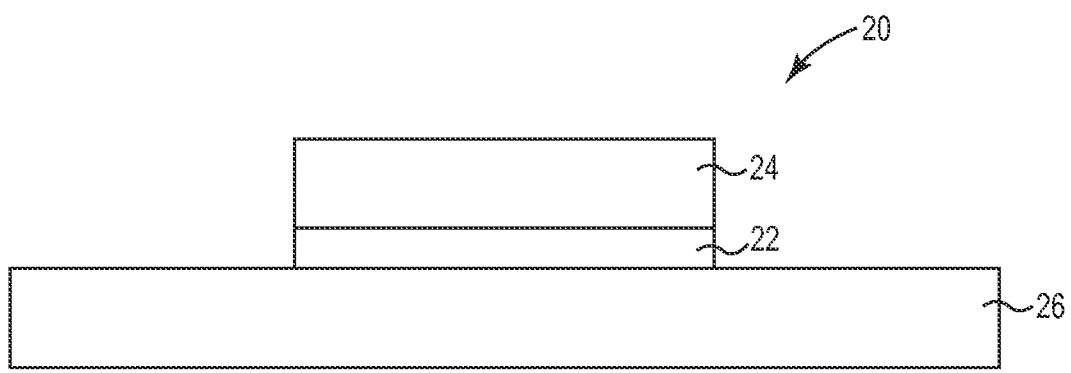
FIG. 1 is a diagram illustrating one example of a device that includes an interposer secured between a semiconductor and a substrate.

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing." etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that features of the various embodiments described herein may be combined with each other, unless specifically noted otherwise.

Some MEMS accelerometers are made by bonding together two separate semiconductor wafers on which electrodes reside facing each other across a small gap. On one side of the gap, rotor electrodes are arrayed on the moving structure referred to as the proof mass or rotor, where the proof mass is connected to the semiconductor die through a set of flexures defined by a semiconductor etching process, such as a Bosch deep silicon etch. On the other side of the gap, stator or fixed electrodes face the moving rotor electrodes. The gap between the rotor electrodes and the stator electrodes is defined by wafer bonding, and the scale factor of the accelerometer is very sensitive to this stator-rotor gap. In one example, the gap between the rotor electrodes and the stator electrodes is less than 2 micrometers (um).

In packaging of a MEMS device, a MEMS is attached to a substrate. Stress is produced in the MEMS via temperature changes due to the difference in the coefficient of thermal expansion (CTE) of the semiconductor material of the MEMS, such as silicon's CTE of 3 parts per million per degree Celcius (ppm/° C.), and the CTE of the substrate, such as an organic substrate's CTE of 18 ppm/° C. or a ceramic substrate's CTE of 7-9 ppm/° C. This differential thermal mechanical stress can distort the MEMS so as to alter the critical stator-rotor gap, which affects the sensor's scale factor and/or displaces the proof mass in the sensing axis and affects the sensor's bias offset. Minimizing variations in these performance parameters is an important goal in packaging a MEMS accelerometer. In addition, the stresses can be large enough to damage the MEMS.

Another deviation that can be introduced in packaging a MEMS device is the tilt of the MEMS relative to the substrate. The functionality of a MEMS accelerometer depends on the sensing axis direction or physical orientation relative to gravitational pull. Sometimes, the non-uniform thickness of die attach adhesive introduces tilt resulting in an unknown deviation in the sensing axis.

A changing scale factor with respect to temperature can be addressed via temperature calibration. The scale factor can be measured at multiple temperatures after assembly and a calibration curve established. Then, the temperature can be sensed by methods, such as an on-chip thermal sense resistor (TSR), and the scale factor corrected via the calibration curve. However, temperature calibration adds cost, and if the scale factor is not linear within the operating temperature of the device, calibration requires more than two temperature points, which could be cost-prohibitive. In addition, hysteresis and stress relaxation in many adhesives and substrates can produce a time and history dependent stress, which limits the effectiveness of temperature calibration.

Ceramic substrates can be used instead of organic substrates, such as FR4, to minimize the thermal mechanical stress. However, even though the amount of change in scale factor and bias offset with temperature is smaller when using a ceramic substrate, it is not eliminated. Also, ceramic substrates are more expensive than organic substrates.

FIG. 1 is a diagram illustrating one example of a device 20 that includes an interposer 22 secured or attached between a semiconductor 24 and a substrate 26. Interposer 22 absorbs stresses between semiconductor 24 and substrate 26, which reduces the stress between semiconductor 24 and substrate 26. Also, semiconductor 24 is supported by interposer 22 and substrate 26, such that the tilt of semiconductor 24 relative to substrate 26 is reduced or eliminated and semiconductor 24 is parallel to substrate 26. In one example, semiconductor 24 is a MEMS device. In one example, substrate 26 has a lower Young's modulus than semiconductor 24. In one example, substrate 26 is an organic substrate. In one example, substrate 26 is FR4. In another example, substrate 26 is a ceramic substrate.

Interposer 22 is a relatively flexible film or sheet of material interposed between semiconductor 24 and substrate 26. Interposer 22 has a lower Young's modulus than semiconductor 24 and a lower Young's modulus than substrate 26. In one example, interposer 22 is a preformed sheet of material. In one example, interposer 22 has a Young's modulus of less than 10 megapascals (MPa). In one example, interposer 22 is at least one of a polymer with viscoelasticity, i.e., an elastomer. rubber, a silicone film, and a urethane film.

Interposer 22 is attached to semiconductor 24 and substrate 26 via adhesives. Interposer 22 adheres to semiconductor 24 via a first adhesive situated between interposer 22 and semiconductor 24, and interposer 22 adheres to substrate 26 via a second adhesive between interposer 22 and substrate 26. In one example, interposer 22 is attached to at least one of semiconductor 24 and substrate 26 via a medium modulus adhesive, defined herein as having a Young's modulus of 0.5 to 1.0 gigapascals (GPa). In one example, interposer 22 is attached to at least one of semiconductor 24 and substrate 26 via an adhesive, such as an epoxy or an acrylate. In one example, interposer 22 is attached to at least one of semiconductor 24 and substrate 26 via a film adhesive, such as a die attach film.

Interposer 22 is thicker than the first adhesive and thicker than the second adhesive, such that stresses between semiconductor 24 and substrate 26 are absorbed primarily by interposer 22. The thickness of interposer 22 can be accurately controlled. In one example, each of the first adhesive and the second adhesive are substantially 25 micrometers (um) thick and interposer 22 is substantially 250 um thick.

Interposer 22 has a footprint that is the same size as the footprint of semiconductor 24. In another example, interposer 22 has a footprint that is larger than the footprint of semiconductor 24. In another example, interposer 22 has a footprint that is smaller than the footprint of semiconductor 24.

Attaching interposer 22 between semiconductor 24 and substrate 26 reduces stress between semiconductor 24 and substrate 26. The stress from substrate 26 is decoupled from semiconductor 24 by interposer 22. Also, the stress resulting from a CTE mismatch of semiconductor 24 and substrate 26 is absorbed by deformation of interposer 22. In addition, semiconductor 24 is supported by interposer 22 and substrate 26, which reduces or eliminates tilt between semiconductor 24 and substrate 26.

Figure 2:
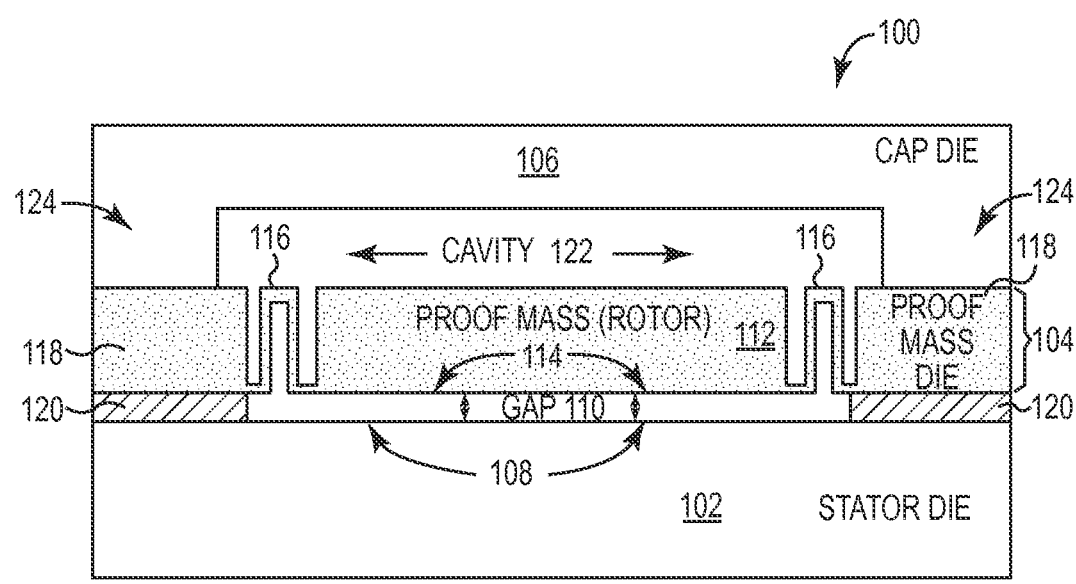
FIG. 2 is a diagram illustrating one example of a MEMS that is an accelerometer.

FIG. 2 is a diagram illustrating one example of a MEMS 100 that is an accelerometer. MEMS 100 includes a stator die 102, a proof mass die 104, and a cap die 106. In one example, semiconductor 24 (shown in FIG. 1) is MEMS 100.

Stator die 102 includes stator or fixed electrodes on stator die face 108, which faces the stator-rotor gap 110 and proof mass 112. Stator die 102 is a semiconductor die, such as silicon, that is processed to provide the stator or fixed electrodes on stator die face 108.

Proof mass die 104 includes the proof mass or rotor 112 that includes rotor electrodes arrayed on proof mass face 114, which faces the stator-rotor gap 110 and the stator or fixed electrodes on stator die face 108 of stator die 102. Proof mass die 104 is a semiconductor die, such as silicon, that is processed to provide the rotor electrodes on proof mass face 114. Proof mass die 104 also includes flexures 116 attached to proof mass 112 and to perimeter portions 118 of proof mass die 104. The flexures 116, which connect proof mass 112 to proof mass die 104, are defined by a semiconductor etching process, such as a Bosch deep silicon etch. In one example, flexures 116 are springs.

Proof mass die 104 is bonded to stator die 102 via bonding material 120, which defines the stator-rotor gap 110 between proof mass 112 and stator die 102. The stator-rotor gap 110 is the gap between the rotor electrodes on proof mass 112 and the stator electrodes on stator die 102. The scale factor of MEMS accelerometer 100 is sensitive to this stator-rotor gap 110. In one example, the stator-rotor gap 110 is less than 2 um. In one example, stator die 102 is one of many stator die on a stator wafer and proof mass die 104 is one of many proof mass die on a proof mass wafer, and the proof mass wafer is bonded to the stator wafer in a wafer level bonding process.

Cap die 106 includes a cavity 122 and rim 124. Cap die 106 is a semiconductor die, such as silicon, that is processed to provide cavity 122 and rim 124. Cavity 122 is positioned over proof mass 112 and flexures 116. Rim 124 is attached to perimeter portions 118 of proof mass die 104 via wafer bonding. In one example, proof mass die 104 is one of many proof mass die on a proof mass wafer and cap die 106 is one of many cap die on a cap wafer that is fixedly attached to the proof mass wafer in a wafer level process.

In operation, proof mass 112 is displaced in relation to stator die 102 as MEMS 100 experiences acceleration. Rotor electrodes on proof mass face 114 are displaced with regard to the stator or fixed electrodes on stator die face 108. Proof mass 112 is displaced to the point that flexures 116 are able to accelerate proof mass 112 at the same rate as stator die 102 and cap die 106. The displacement of proof mass 112 is measured to give the acceleration.

Figure 3A:
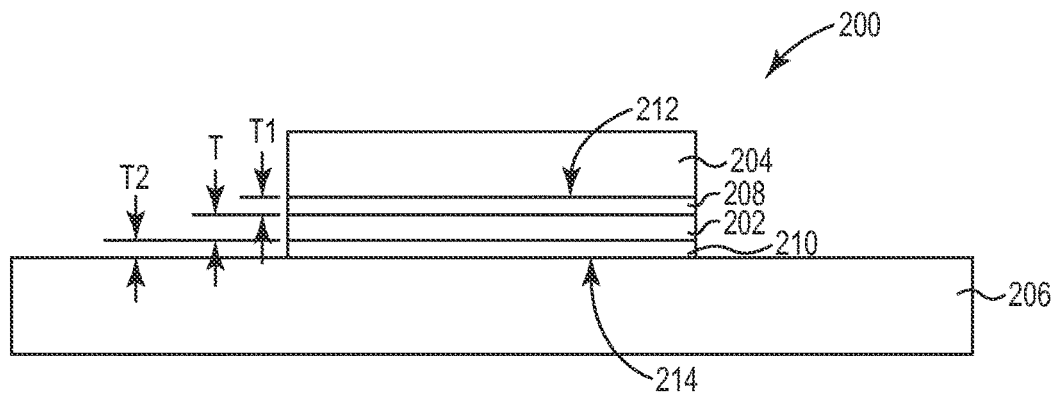
FIG. 3A is a diagram illustrating one example of a device that includes an interposer having a footprint that is the same size as the footprint of the semiconductor.

FIG. 3A is a diagram illustrating one example of a device 200 that includes an interposer 202 situated between a semiconductor 204 and a substrate 206. In one example, device 200 is similar to device 20 of FIG. 1. In one example, interposer 202 is similar to interposer 22 (shown in FIG. 1). In one example, semiconductor 204 is similar to semiconductor 24 (shown in FIG. 1). In one example, substrate 206 is similar to substrate 26 (shown in FIG. 1). In one example, semiconductor 204 is similar to MEMS 100 of FIG. 2.

Interposer 202 is secured or attached to semiconductor 204 and substrate 206 via a first adhesive 208 and a second adhesive 210. Semiconductor 204 includes a first surface 212 that is parallel with interposer 202 and substrate 206 includes a second surface 214 that is parallel with interposer 202. Interposer 202 adheres to first surface 212 via first adhesive 208, and interposer 202 adheres to second surface 214 via second adhesive 210. In one example, at least one of first adhesive 208 and second adhesive 210 is a medium modulus adhesive. In one example, at least one of first adhesive 208 and second adhesive 210 is an adhesive, such as an epoxy or an acrylate. In one example, at least one of first adhesive 208 and second adhesive 210 is a film adhesive, such as a die attach film.

Interposer 202 is a flexible film or sheet of material situated between semiconductor 204 and substrate 206. Interposer 202 has a lower Young's modulus than semiconductor 204 and a lower Young's modulus than substrate 206. In one example, interposer 202 is a preformed sheet of material. In one example, interposer 202 has a Young's modulus of less than 10 MPa. In one example, interposer 202 is at least one of a polymer with viscoelasticity, i.e., an elastomer, rubber, a silicone film, and a urethane film.

Interposer 202 is thicker than first adhesive 208 and second adhesive 210. Interposer 202 has a thickness T that is greater than a first thickness T1 of first adhesive 208 and greater than a second thickness T2 of second adhesive 210. The thickness T of interposer 202 can be accurately controlled to absorb stresses between semiconductor 204 and substrate 206. These stresses are primarily absorbed by interposer 202. In one example, first thickness T1 of first adhesive 208 is substantially 25 um, second thickness T2 of second adhesive 210 is substantially 25 um, and thickness T of interposer 202 is substantially 250 um.

Figure 3B:
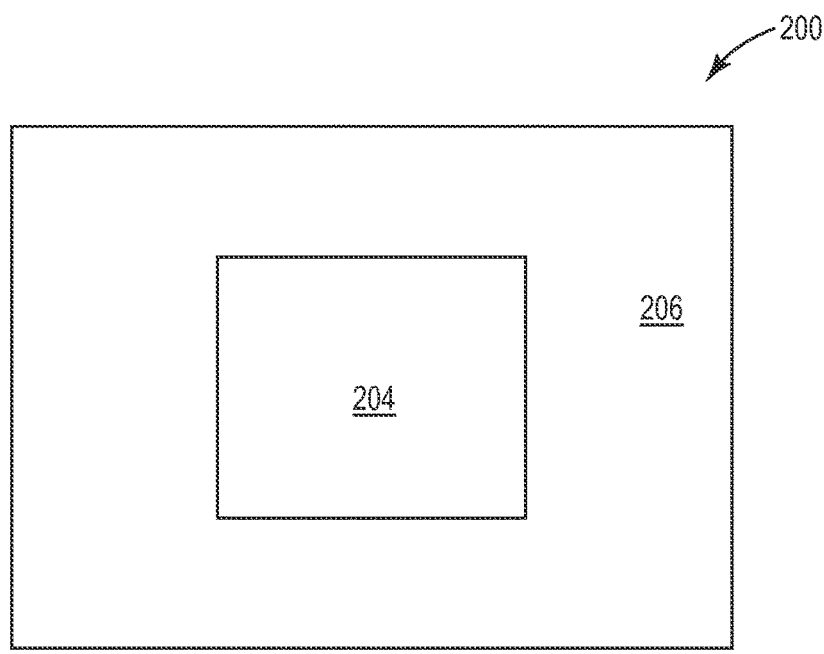
FIG. 3B is a top-view diagram illustrating the device of FIG. 3A.

FIG. 3B is a top-view diagram illustrating device 200 including semiconductor 204 and substrate 206. Semiconductor 204 has a footprint defined by the outline of semiconductor 204. Interposer 202 has a footprint that is the same size as the footprint of semiconductor 204. Attaching interposer 202 between semiconductor 204 and substrate 206 reduces stress between semiconductor 204 and substrate 206. The stress from substrate 206 is decoupled from semiconductor 204 by interposer 202. Also, the stress resulting from a CTE mismatch of semiconductor 204 and substrate 206 is absorbed by deformation of interposer 202. In addition, semiconductor 204 is supported by interposer 202 and substrate 206, which reduces or eliminates tilt between semiconductor 204 and substrate 206.

Figure 4A:
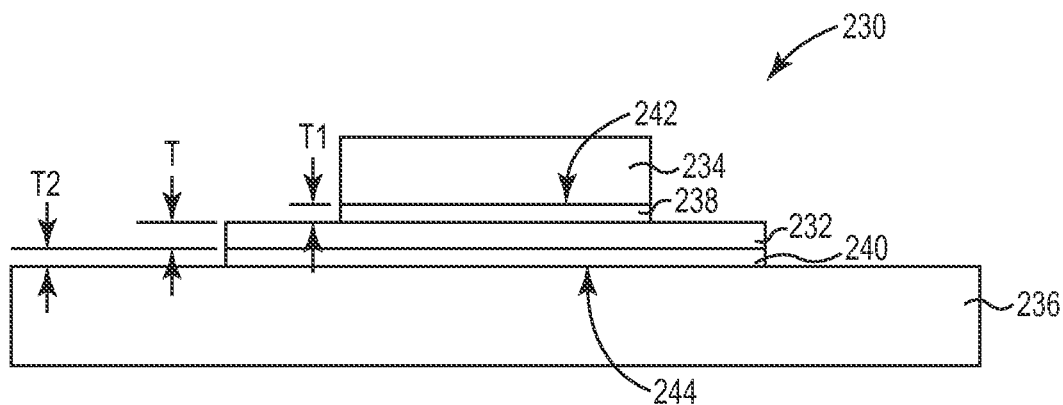
FIG. 4A is a diagram illustrating one example of a device that includes an interposer having a larger footprint than the footprint of the semiconductor.

FIG. 4A is a diagram illustrating one example of a device 230 that includes an interposer 232 having a larger footprint than the footprint of semiconductor 234. Interposer 232 is situated between semiconductor 234 and substrate 236. In one example, device 230 is similar to device 20 of FIG. 1. In one example, interposer 232 is similar to interposer 22 (shown in FIG. 1). In one example, semiconductor 234 is similar to semiconductor 24 (shown in FIG. 1). In one example, substrate 236 is similar to substrate 26 (shown in FIG. 1). In one example, semiconductor 234 is similar to MEMS 100 of FIG. 2.

Interposer 232 is secured or attached to semiconductor 234 and substrate 236 via a first adhesive 238 and a second adhesive 240. Semiconductor 234 includes a first surface 242 that is parallel with interposer 232, and substrate 236 includes a second surface 244 that is parallel with interposer 232. Interposer 232 adheres to first surface 242 via first adhesive 238, and interposer 232 adheres to second surface 244 via second adhesive 240. In one example, at least one of first adhesive 238 and second adhesive 240 is a medium modulus adhesive. In one example, at least one of first adhesive 238 and second adhesive 240 is an adhesive, such as an epoxy or an acrylate. In one example, at least one of first adhesive 238 and second adhesive 240 is a film adhesive, such as a die attach film.

Interposer 232 is a flexible film or sheet of material situated between semiconductor 234 and substrate 236. Interposer 232 has a lower Young's modulus than semiconductor 234 and a lower Young's modulus than substrate 236. In one example, interposer 232 is a preformed sheet of material. In one example, interposer 232 has a Young's modulus of less than 10 MPa. In one example, interposer 232 is at least one of a polymer with viscoelasticity, i.e., an elastomer, rubber, a silicone film, and a urethane film.

Interposer 232 is thicker than first adhesive 238 and second adhesive 240. Interposer 232 has a thickness T that is greater than a first thickness T1 of first adhesive 238 and greater than a second thickness T2 of second adhesive 240. The thickness T of interposer 232 can be accurately controlled to absorb stresses between semiconductor 234 and substrate 236. These stresses are primarily absorbed by interposer 232. In one example, first thickness T1 of first adhesive 238 is substantially 25 um, second thickness T2 of second adhesive 240 is substantially 25 um, and thickness T of interposer 232 is substantially 250 um.

Figure 4B:
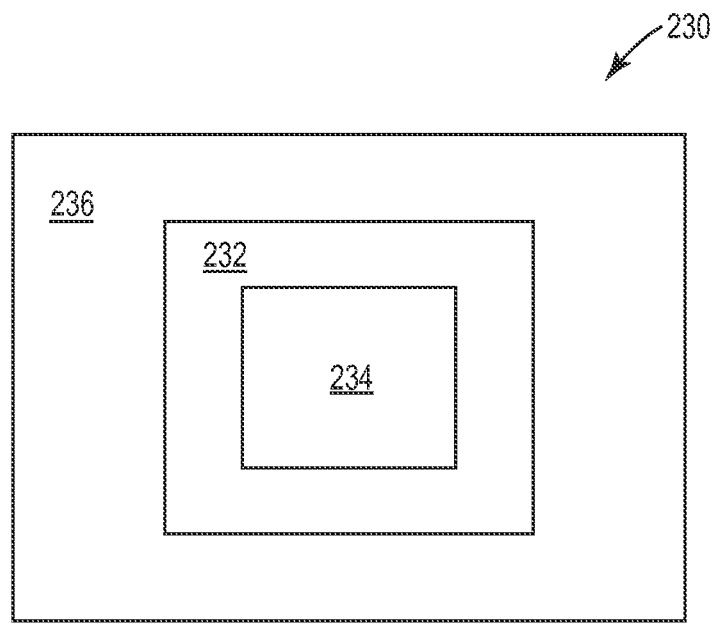
FIG. 4B is a top-view diagram illustrating the device of FIG. 4A.

FIG. 4B is a top-view diagram illustrating device 230 including interposer 232, semiconductor 234, and substrate 236. Interposer 232 has a footprint defined by the outline of interposer 232, and semiconductor 234 has a footprint defined by the outline of semiconductor 234. First adhesive 238 is situated within the footprint of semiconductor 234, and second adhesive 240 is situated within the footprint of interposer 232. Interposer 232 has a footprint that is larger than the footprint of semiconductor 234.

Attaching interposer 232 between semiconductor 234 and substrate 236 reduces stress between semiconductor 234 and substrate 236. The stress from substrate 236 is decoupled from semiconductor 234 by interposer 232. Also, the stress resulting from a CTE mismatch of semiconductor 234 and substrate 236 is absorbed by deformation of interposer 232. In addition, semiconductor 234 is supported by interposer 232 and substrate 236, which reduces or eliminates tilt between semiconductor 234 and substrate 236.

Figure 5A:
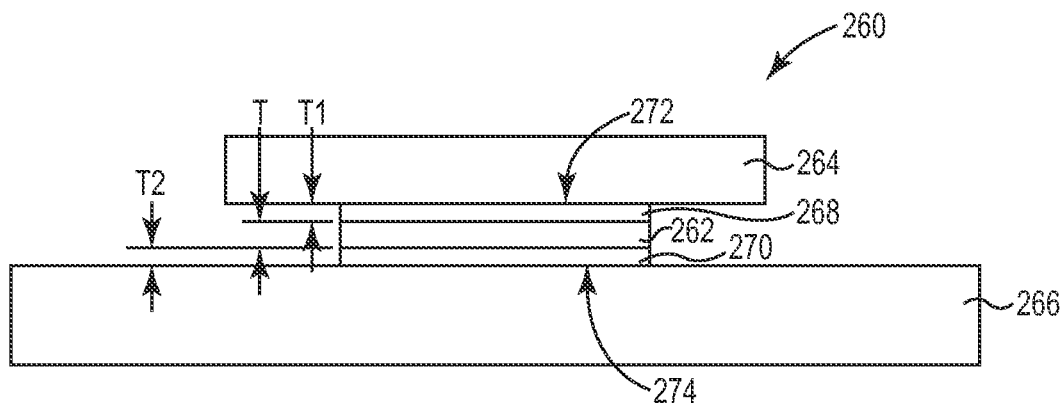
FIG. 5A is a diagram illustrating one example of a device that includes an interposer having a smaller footprint than the footprint of the semiconductor.

FIG. 5A is a diagram illustrating one example of a device 260 that includes an interposer 262 having a smaller footprint than the footprint of semiconductor 264. Interposer 262 is situated between semiconductor 264 and substrate 266. In one example, device 260 is similar to device 20 of FIG. 1. In one example, interposer 262 is similar to interposer 22 (shown in FIG. 1). In one example, semiconductor 264 is similar to semiconductor 24 (shown in FIG. 1). In one example, substrate 266 is similar to substrate 26 (shown in FIG. 1). In one example, semiconductor 264 is similar to MEMS 100 of FIG. 2.

Interposer 262 is secured or attached to semiconductor 264 and substrate 266 via a first adhesive 268 and a second adhesive 270. Semiconductor 264 includes a first surface 272 that is parallel with interposer 262, and substrate 266 includes a second surface 274 that is parallel with interposer 262. Interposer 262 adheres to first surface 272 via first adhesive 268, and interposer 262 adheres to second surface 274 via second adhesive 270. In one example, at least one of first adhesive 268 and second adhesive 270 is a medium modulus adhesive. In one example, at least one of first adhesive 268 and second adhesive 270 is an adhesive, such as an epoxy or an acrylate. In one example, at least one of first adhesive 268 and second adhesive 270 is a film adhesive, such as a die attach film.

Interposer 262 is a flexible film or sheet of material situated between semiconductor 264 and substrate 266. Interposer 262 has a lower Young's modulus than semiconductor 264 and a lower Young's modulus than substrate 266. In one example, interposer 262 is a preformed sheet of material. In one example, interposer 262 has a Young's modulus of less than 10 MPa. In one example, interposer 262 is at least one of a polymer with viscoelasticity, i.e., an elastomer, rubber, a silicone film, and a urethane film.

Interposer 262 is thicker than first adhesive 268 and second adhesive 270. Interposer 262 has a thickness T that is greater than a first thickness T1 of first adhesive 268 and greater than a second thickness T2 of second adhesive 270. The thickness T of interposer 262 can be accurately controlled to absorb stresses between semiconductor 264 and substrate 266. These stresses are primarily absorbed by interposer 262. In one example, first thickness T1 of first adhesive 268 is substantially 25 um, second thickness T2 of second adhesive 270 is substantially 25 um, and thickness T of interposer 262 is substantially 250 um.

Figure 5B:
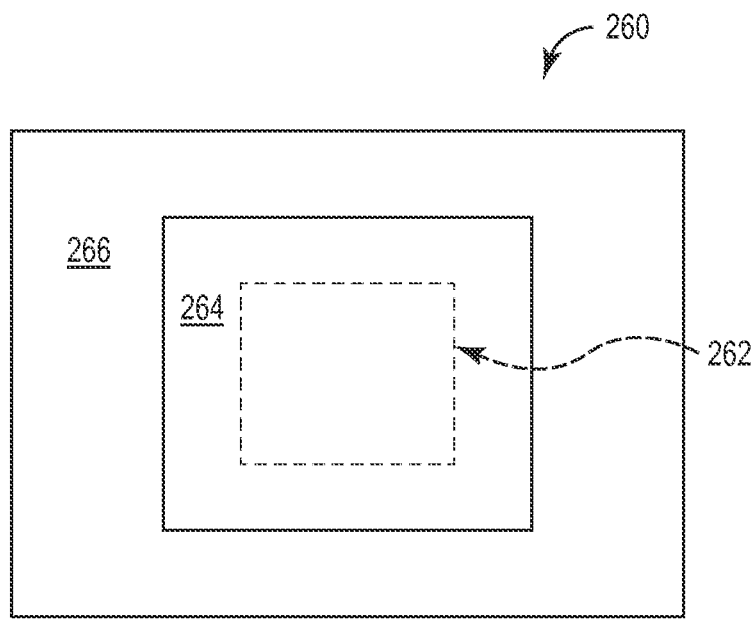
FIG. 5B is a top-view diagram illustrating the device of FIG. 5A.

FIG. 5B is a top-view diagram illustrating device 260 including interposer 262, semiconductor 264, and substrate 266. Interposer 262 has a footprint defined by the dashed outline of interposer 262, and semiconductor 264 has a footprint defined by the outline of semiconductor 264. First adhesive 268 is situated within the footprint of interposer 262, and second adhesive 270 is situated within the footprint of interposer 262. Interposer 262 has a footprint that is smaller than the footprint of semiconductor 234.

Attaching interposer 262 between semiconductor 264 and substrate 266 reduces stress between semiconductor 264 and substrate 266. The stress from substrate 266 is decoupled from semiconductor 264 by interposer 262. Also, the stress resulting from a CTE mismatch of semiconductor 264 and substrate 266 is absorbed by deformation of interposer 262. In addition, semiconductor 264 is supported by interposer 262 and substrate 266, which reduces or eliminates tilt between semiconductor 264 and substrate 266.

Figure 6:
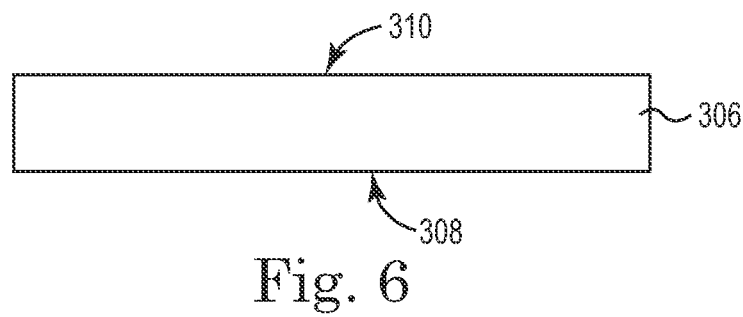
FIG. 6 is a diagram illustrating a substrate.
Figure 7:
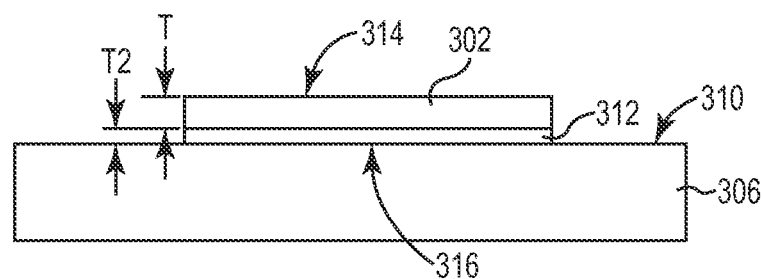
FIG. 7 is a diagram illustrating an interposer attached to the substrate of FIG. 6.
Figure 8:
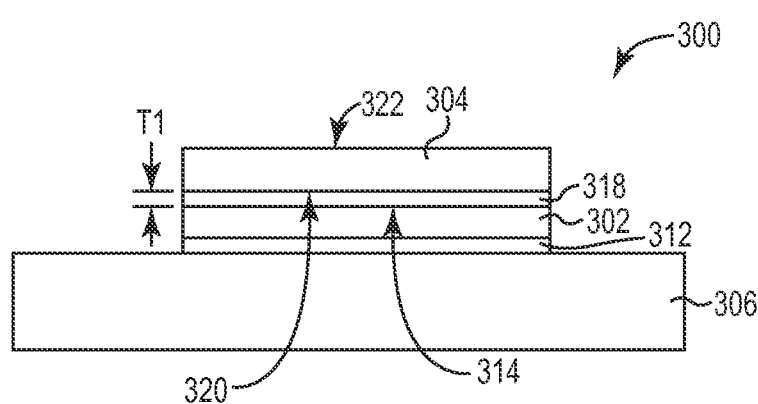
FIG. 8 is a diagram illustrating a semiconductor attached to the interposer and substrate of FIG. 7.

FIGS. 6, 7, and 8 are diagrams illustrating one example of a method of assembling a device 300 that includes an interposer 302, a semiconductor 304, and a substrate 306. In one example, device 300 is similar to device 20 of FIG. 1. In one example, device 300 is similar to device 200 of FIGS. 3A and 3B. In one example, device 300 is similar to device 230 of FIGS. 4A and 4B. In one example, device 300 is similar to device 260 of FIGS. 5A and 5B.

FIG. 6 is a diagram illustrating substrate 306, which includes first surface 308 and second surface 310 that opposes first surface 308. In one example, substrate 306 is similar to substrate 26 (shown in FIG. 1). In one example, substrate 306 is similar to substrate 206 (shown in FIGS. 3A and 3B). In one example, substrate 306 is similar to substrate 236 (shown in FIGS. 4A and 4B). In one example, substrate 306 is similar to substrate 266 (shown in FIGS. 5A and 5B).

Substrate 306 is an organic substrate. In one example, substrate 306 is FR4. In another example, substrate 306 is a ceramic substrate.

FIG. 7 is a diagram illustrating interposer 302 attached to substrate 306 via second adhesive 312. In one example, interposer 302 is similar to interposer 22 (shown in FIG. 1). In one example, interposer 302 is similar to interposer 202 (shown in FIGS. 3A and 3B). In one example, interposer 302 is similar to interposer 232 (shown in FIGS. 4A and 4B). In one example, interposer 302 is similar to interposer 262 (shown in FIGS. 5A and 5B).

Interposer 302 includes first surface 314 and second surface 316 that opposes first surface 314. Second surface 316 of interposer 302 is attached to or adheres to second surface 310 of substrate 306 via second adhesive 312. In one example, second adhesive 312 is a medium modulus adhesive. In one example, second adhesive 312 is an adhesive, such as an epoxy or an acrylate. In one example, second adhesive 312 is a film, such as a die attach film.

Interposer 302 is a preformed, flexible sheet of material that is thicker than second adhesive 312. Interposer 302 has a thickness T that is greater than the second thickness T2 of second adhesive 312. Also, interposer 302 has a lower Young's modulus than semiconductor 304 and a lower Young's modulus than substrate 306. In one example, interposer 302 has a Young's modulus of less than 10 MPa. In one example, interposer 302 is at least one of a polymer with viscoelasticity, i.e., an elastomer, rubber, a silicone film, and a urethane film.

FIG. 8 is a diagram illustrating semiconductor 304 attached to interposer 302 via first adhesive 318. In one example, semiconductor 304 is similar to semiconductor 24 (shown in FIG. 1). In one example, semiconductor 304 is similar to semiconductor 204 (shown in FIGS. 3A and 3B). In one example, semiconductor 304 is similar to semiconductor 234 (shown in FIGS. 4A and 4B). In one example, semiconductor 304 is similar to semiconductor 264 (shown in FIGS. 5A and 5B). In one example, semiconductor 304 is similar to MEMS 100 of FIG. 2.

Semiconductor 304 includes first surface 320 and second surface 322 that opposes first surface 320. First surface 314 of interposer 302 is attached to or adheres to first surface 320 of semiconductor 304 via first adhesive 318. In one example, first adhesive 318 is a medium modulus adhesive. In one example, first adhesive 318 is an adhesive, such as an epoxy or an acrylate. In one example, first adhesive 318 is a film, such as a die attach film.

Thickness T of interposer 302 is greater than first thickness T1 of first adhesive 318. The thickness T of interposer 302 can be accurately controlled to absorb stresses between semiconductor 304 and substrate 306. These stresses are absorbed by interposer 302. In one example, first thickness T1 is substantially 25 um, second thickness T2 is substantially 25 um, and thickness T is substantially 250 um.

Interposer 302 has a footprint that is the same size as the footprint of semiconductor 304. In another example, interposer 302 has a footprint that is larger than the footprint of semiconductor 304. In another example, interposer 302 has a footprint that is smaller than the footprint of semiconductor 304.

Attaching interposer 302 between semiconductor 304 and substrate 306 reduces the bending stress on semiconductor 304 and the stress resulting from a CTE mismatch of semiconductor 304 and substrate 306. If the device is a MEMS accelerometer, this stabilizes the electrode gap in the MEMS accelerometer. Also, lower cost substrates can be used and temperature calibration can be avoided, which reduces the cost of the device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device comprising:
   a semiconductor;
   a substrate; and
   an interposer attached between the semiconductor and the substrate, wherein the interposer has a lower Young's modulus than the semiconductor and the interposer has a lower Young's modulus than the substrate to absorb stresses between the semiconductor and the substrate, wherein the interposer has a Young's modulus of less than 10 mega-pascals.

2. The device of claim 1, wherein the interposer adheres to the semiconductor via a first adhesive and the interposer adheres to the substrate via a second adhesive.

3. The device of claim 2, wherein the interposer is thicker than the first adhesive and the interposer is thicker than the second adhesive.

4. The device of claim 1, wherein the interposer has a smaller footprint than the semiconductor.

5. The device of claim 1, wherein the interposer is a preformed sheet of at least one of a polymer with viscoelasticity, a rubber, a silicone film, and a urethane film.

6. The device of claim 1, wherein the interposer is attached between the semiconductor and the substrate via at least one of a medium modulus adhesive and a film adhesive.

7. A system comprising:
   a MEMS having a first surface;
   a substrate having a second surface; and
   an interposer attached to the first surface via a first adhesive and to the second surface via a second adhesive, wherein the interposer is thicker than the first adhesive and the second adhesive and the interposer has a lower Young's modulus than the semiconductor and the interposer has a lower Young's modulus than the substrate to absorb stresses between the semiconductor and the substrate, wherein the interposer has a Young's modulus of less than 10 mega-pascals.

8. The system of claim 7, wherein the interposer is attached to at least one of the first surface and the second surface via at least one of a medium modulus adhesive and a film adhesive.

9. A method of assembling a device comprising:
   providing a semiconductor;
   providing a substrate;
   attaching an interposer between the semiconductor and the substrate, the interposer having a lower Young's modulus than the semiconductor and the interposer having a lower Young's modulus than the substrate to absorb stresses between the semiconductor and the substrate, wherein the interposer has a Young's modulus of less than 10 mega-pascals.

10. The method of claim 9, wherein attaching an interposer comprises:
    adhering the interposer to the semiconductor via a first adhesive that is thinner than the interposer; and
    adhering the interposer to the substrate via a second adhesive that is thinner than the interposer.

11. The method of claim 9, wherein attaching an interposer comprises:
    attaching the interposer between the semiconductor and the substrate via at least one of a medium modulus adhesive and a film adhesive.

12. The method of claim 9, wherein attaching an interposer comprises: attaching an interposer having a smaller footprint to a semiconductor having a larger footprint.

* * * * *